United States Patent [19]
Yeh

[11] Patent Number: 5,949,240
[45] Date of Patent: Sep. 7, 1999

[54] TEST CONNECTING DEVICE INCLUDING TESTKEY AND PROBE CARD FOR USE IN THE TESTING OF INTEGRATED CIRCUITS

[75] Inventor: Meng-Lin Yeh, Taipei, Taiwan

[73] Assignee: United Semiconductor Corp., Taiwan

[21] Appl. No.: 08/959,520

[22] Filed: Oct. 28, 1997

[30] Foreign Application Priority Data

Sep. 2, 1997 [TW] Taiwan .................................. 86112563

[51] Int. Cl.$^6$ .................................................. G01R 1/073
[52] U.S. Cl. ............................................ 324/754; 324/763
[58] Field of Search .................................... 324/754, 72.5, 324/149, 763, 765

[56] References Cited

U.S. PATENT DOCUMENTS

| | | | |
|---|---|---|---|
| 2,884,597 | 4/1959 | Miller | 324/72.5 |
| 4,697,143 | 9/1987 | Lockwood et al. | 324/754 |
| 4,894,612 | 1/1990 | Drake et al. | 324/754 |
| 5,512,838 | 4/1996 | Roach | 324/754 |

*Primary Examiner*—Ernest Karlsen
*Attorney, Agent, or Firm*—Finnegan, Henderson, Farabow, Garrett & Dunner, L.L.P.

[57] ABSTRACT

A test connecting device including testkey and probe card for use in the testing of integrated circuits is provided. This test connecting device features the use of a symmetrical node-potential scheme that can offset the parasite capacitances between the probe pins on the probe card, thus allowing an increase in frequency response of the probe card. The probe card includes at least six probe pins arranged in a row; and correspondingly, the testkey includes at least six test pads for the six probe pins to make electrical contacts with them during the testing while the probe card is coupled to the testkey. This test connecting device can allow a high-frequency output signal to pass therethrough to the test instrument without causing attenuation to the signal. Moreover, the use of the test connecting device can eliminate the need to install additional hardware components, such as frequency dividers or additional stages to ring oscillators. The test connecting device is thus easy to implement, without having to take up further circuit areas in the integrated circuits.

9 Claims, 2 Drawing Sheets

TEST CONNECTING DEVICE INCLUDING TESTKEY AND PROBE CARD FOR USE IN THE TESTING OF INTEGRATED CIRCUITS

BACKGROUND OF THE INVENTION

1. Field of the Invention

This invention relates to means for testing integrated circuits in semiconductor fabrications, and more particularly, to a test connecting device including testkey and probe card for use in the testing of integrated circuits, which can prevent a low-pass filter (LPF) effect to the probe card that would otherwise result from parasite capacitances between the probe pins on the probe card, so that the frequency response of the output signal from the integrated circuit being tested can be increased to high-frequency band.

2. Description of Related Art

Integrated circuits are key elements in computers and various other intelligent electronic devices which are now indispensable tools in the information age. In the semiconductor fabrication processes, one important procedure is to test the fabricated IC chips so as to verify their reliability and performance before shipping to the customers.

FIG. 1 shows a conventional test connecting device including a testkey (which is enclosed in a dashed box indicated by the reference numeral 70) and a probe card (which is enclosed in another dashed box indicated by the reference numeral 100) for use in the testing of integrated circuits. In this particular example, the probe card 100 is of the type that comes with the HP4062 semiconductor test instrument from Hewlett Packard Corporation. This test connecting device is used to electrically connect an IC chip (not shown) being tested to the test instrument (not shown) for the test instrument to measure various electrical characteristics of the IC chip being tested.

As shown, the testkey 70 includes at least one device unit 250 and six test pads 10, 20, 30, 40, 50, 60. The device unit 250 has a $V_{OUT}$ port connected to the third test pad 30, a $V_{CC1}$ port connected to the first test pad 10, a $V_{CC2}$ port connected to the second test pad 20, and a GND port connected to the fourth test pad 40. In the case of FIG. 1, for example, the fifth and sixth test pads 50, 60 are floating. The device unit 250 is used to hold an integrated circuit (not shown) being tested.

The probe card 100 includes a row of at least six probe pins 110, 120, 130, 140, 150,160. During testing, the probe card 100 is coupled to the testkey 70 in such a manner that the first probe pin 110 comes into electrical contact with the first test pad 10 to be electrically connected to the $V_{CC1}$ port of the device unit 250; the second probe pin 120 comes into electrical contact with the second test pad 20 to be electrically connected to the $V_{CC2}$ port; the third probe pin 130 comes into electrical contact with the third test pad 30 to be electrically connected to the $V_{OUT}$ port; and the fourth probe pin 140 comes into electrical contact with the fourth test pad 40 to be electrically connected to the GND port. In the case of FIG. 1, for example, the fifth and sixth probe pins 150, 160 are not in use since they come into electrical contact with the fifth and sixth test pads 50, 60 which are floating. During the testing, a first voltage $V_{CC1}$ is supplied via the first probe pin 110 and first test pad 10 to the $V_{CC1}$ port of the device unit 250, and a second voltage $V_{CC2}$ is supplied via the second probe pin 120 and second test pad 20 to the $V_{CC2}$ port, while the GND port of the device unit 250 is connected via the fourth test pad 40 and fourth probe pin 140 to the ground. With this power connection, the device unit 250 generates an output signal which is sent out from the $V_{OUT}$ port thereof and then transferred via the third test pad 30 and the third probe pin 130 to a test instrument (not shown) used to measure the electrical characteristics of the device unit 250 from this output signal. The device unit 250 include ring oscillators or frequency dividers that can be used to test integrated circuits fabricated under the same environmental conditions.

The use of the foregoing HP4062 probe card 100, however, has one drawback during testing, in that the spacings between the probe pins 110, 120, 130, 140, 150, 160 are small enough to cause parasite capacitances to appear therebetween. That is, according to basic electrical principles, the parasite capacitance C between one neighboring pair of the probe pins 110, 120, 130, 140, 150, 160 can be expressed as follows:

$$C = (\epsilon \cdot A)/d$$

where $\epsilon$ is the permitivity of air;

A is the lateral area of each probe pin; and d is the length of spacing between the neighboring pair of probe pins. Therefore, if d is very small, the parasite capacitance C will be large enough to cause the undesired effect of virtual short circuit between the probe pins when the output signal from the $V_{OUT}$ port is in the high-frequency band. In the case of FIG. 1, one parasite capacitance $C_{P23}$ will exist between the second probe pin 120 and the third probe pin 130, and another parasite capacitance $C_{P34}$ will exist between the third probe pin 130 and the fourth probe pin 140.

When a high-frequency output signal from the $V_{OUT}$ port of the device unit 250 passes through third probe pin 130, the parasite capacitance $C_{P23}$ between the second probe pin 120 and the third probe pin 130 and the parasite capacitance $C_{P34}$ between the third probe pin 130 and the fourth probe pin 140 would become virtual short circuits between the same. These virtual short circuits would then cause the high-frequency output signal in the third probe pin 130 to be partly bypassed to the fourth probe pin 140 which is connected to the ground, thus causing the signal received by the test instrument (not shown) to have an attenuated magnitude. Moreover, since the second probe pin 120 is connected to a voltage source of $V_{CC2}$, a current would flow via the virtual short circuit to the third probe pin 130, which is then mixed to the output signal in the third probe pin 130 such that the signal received by the test instrument (not shown) would contain a DC component.

Therefore, the existence of the parasite capacitances $C_{P23}$ and $C_{P34}$ in the probe card 100 would cause the probe card 100 to act like a low-pass filter that would reject high-frequency components in the output signal from the $V_{OUT}$ port. The measurements of electrical characteristics from the test instrument are thus unreliable.

To solve the foregoing problem, one solution is to lower the frequency of the output signal through the use of frequency dividers or ring oscillators with increased number of stages, so that the signal passing through the probe pin to the test instrument has a low frequency that can pass through the probe card. However, in the case of the HP4062 semiconductor test instrument, since it has a bandwidth below 6 MHz, the use of frequency dividers or ring oscillators with increased number of stages requires additional hardware components that will take up space in the integrated circuits, and may cause deviations to the actual frequency of the output signal.

SUMMARY OF THE INVENTION

It is therefore an objective of the present invention to provide a test connecting device including testkey and probe card for use in the testing of integrated circuits, which can eliminate the above-mentioned undesired effects due to the existence of parasite capacitances between the probe pins in the probe card.

In accordance with the foregoing and other objectives of the present invention, a new test connecting device including testkey and probe card for use in the testing of integrated circuits is provided. The test connecting device of the invention includes a specially designed testkey and probe card which are designed based on a symmetrical node-potential scheme that can offset the parasite capacitances between the probe pins on the probe card.

The testkey includes:

(a) at least one device unit having a first voltage port, a second voltage port, a signal output port, and a ground port; and (b) at least six test pads arranged in a row, including a first test pad electrically connected to the first voltage port of the device unit; a second test pad electrically connected to the signal output port of the device unit; a third test pad electrically connected to the signal output port of the device unit; a fourth test pad electrically connected to the signal output port of the device unit; a fifth test pad electrically connected to the second voltage port of the device unit; and a sixth test pad electrically connected to the ground port of the device unit.

And the probe card includes at least six probe pins arranged in a row corresponding to the at least six test pads on the testkey. These six probe pins include:

a first probe pin having one end connected to a first voltage supply and the other end for use to make electrical contact with the first test pad on the testkey during testing;

a second probe pin neighboring the first probe pin, the second probe pin having one end serving as dummy output for guard and the other end for use to make electrical contact with the second test pad on the testkey during testing;

a third probe pin neighboring the second probe pin, the third probe pin having one end serving as output for the output signal from the signal output port of the device unit and the other end for use to make electrical contact with the third test pad on the testkey during testing;

a fourth probe pin neighboring the third probe pin, the fourth probe pin having one end serving as dummy output for guard and the other end for use to make electrical contact with the fourth test pad on the testkey during testing;

a fifth probe pin neighboring the fourth probe pin, the fifth probe pin having one end connected to a second voltage supply and the other end for use to make electrical contact with the fifth test pad on the testkey during testing; and a sixth probe pin neighboring the fifth probe pin, the fifth probe pin having one end connected to the ground and the other end for use to make electrical contact with the sixth test pad on the testkey during testing.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In semiconductor fabrication, the testkey is customarily provided on both sides of a semiconductor device, which is used in the measurement of various electrical characteristics of the semiconductor device fabricated under the same environmental conditions. These electrical characteristics include resistance values, capacitance values, inductance values, frequency responses, current-versus-voltage relationships of transistors, and so forth. The testkey is therefore vital to the dependability of the measured data. This invention discloses a new test connecting device including testkey and probe card for use in the testing of integrated circuits, by which the undesired effects mentioned in the background section of this specification would be eliminated.

Figure 1:
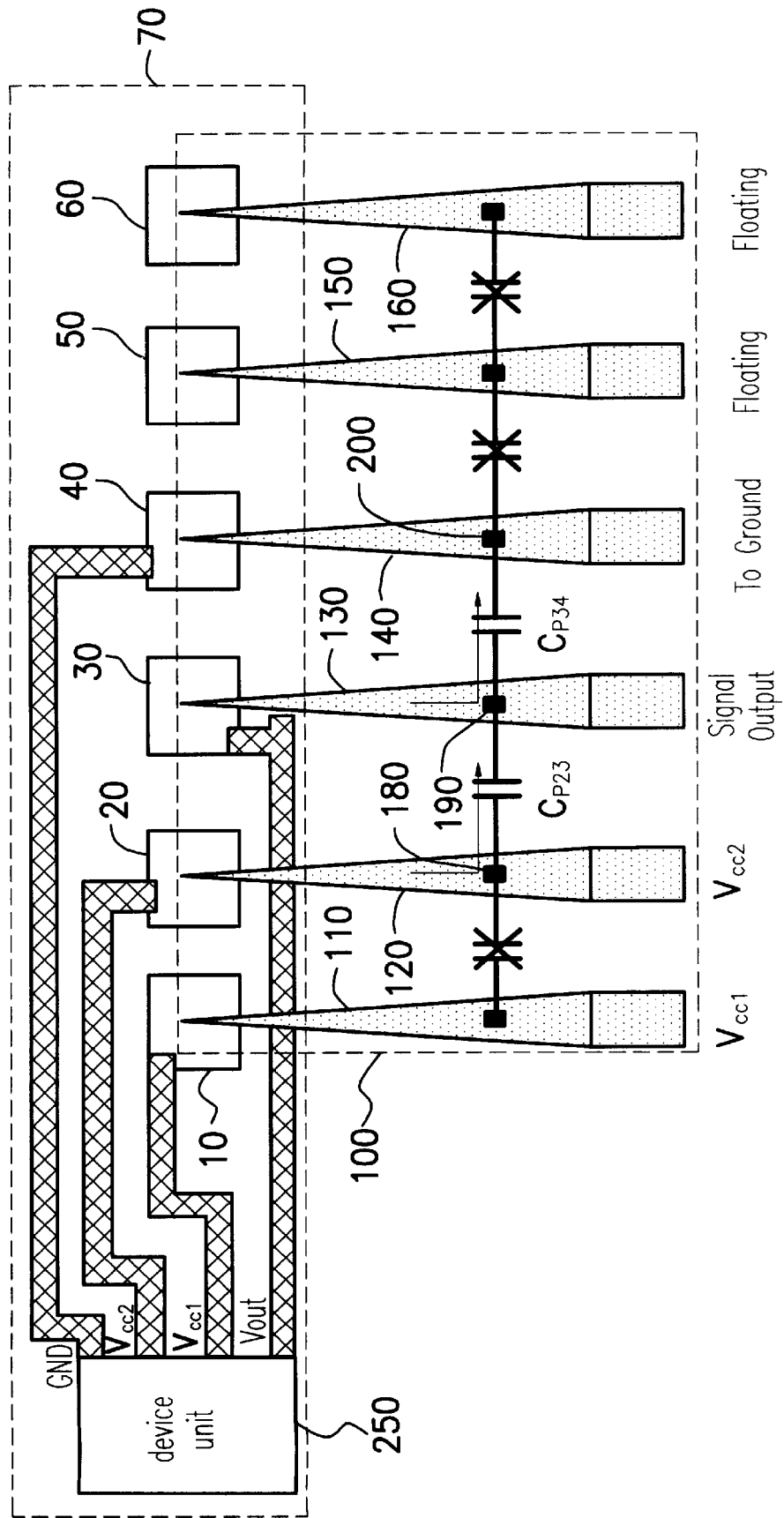
FIG. 1 is a schematic diagram showing a conventional test connecting device including a testkey and a probe card for use in the testing of integrated circuits.
Figure 2:
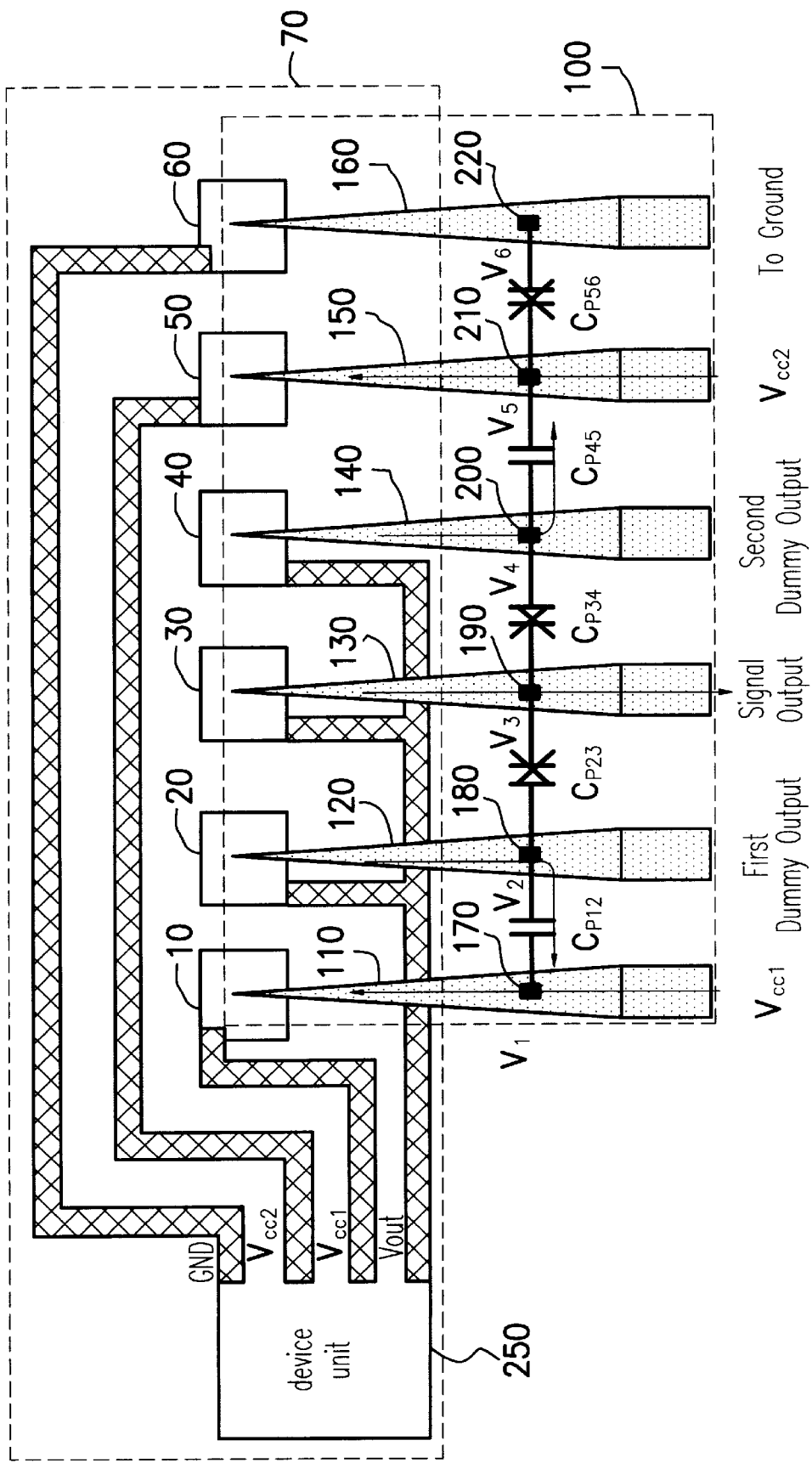
FIG. 2 is a schematic diagram showing the test connecting device including testkey and probe card with dummy output for guard according to the invention.

FIG. 2 shows the test connecting device including a testkey (which is enclosed in a dashed box indicated by the reference numeral 70) and a probe card (which is enclosed in another dashed box indicated by the reference numeral 100) which are designed in accordance with the invention for use in the testing of integrated circuits. In FIG. 2, the constituent parts that are identical to those shown in FIG. 1 are labeled with the same reference numerals.

The probe card 100 serves as an interface to a semiconductor test instrument (not shown), such as the HP4062 semiconductor test instrument, which includes a row of at least six probe pins 110, 120, 130, 140, 150, 160. This probe card 100 differs from that in the prior art of FIG. 1 in that here the first probe pin 110 is connected to supply a first voltage $V_{CC1}$ to the $V_{CC1}$ port of the device unit 250; the second probe pin 120 serves as a first dummy output for guard, the third probe pin 130 is used to receive the output signal from the $V_{OUT}$ port of the device unit 250; the fourth probe pin 140 serves as a second dummy output for guard; the fifth probe pin 150 is connected to supply a second voltage $V_{CC2}$ to the $V_{CC2}$ port of the device unit 250; and the sixth probe pin 160 is connected to the ground. The first voltage $V_{CC1}$ is equal in magnitude to the second voltage $V_{CC2}$.

The testkey 70 is similar in part to that in the prior art of FIG. 1, which includes a device unit 250 and test pads 10, 20, 30, 40, 50, 60, but differs from the prior art in that its $V_{OUT}$ port is connected to each of the second, third, and fourth test pads 20, 30, 40; its $V_{CC1}$ port is connected to the first test pad 10; its $V_{CC2}$ port is connected to the fifth test pad 50; and its GND port is connected to the sixth test pad 60.

As mentioned earlier, a parasite capacitance exists between each neighboring pair of the six probe pins 110, 120, 130, 140, 150, 160, as $C_{P12}$ between the first and second probe pins 110, 120; $C_{P23}$ between the second and third probe pins 120, 130; $C_{P34}$ between the third and fourth probe pins 130, 140; $C_{P45}$ between the fourth and fifth probe pins 140, 150; and $C_{P56}$ between the fifth and sixth probe pins 150.

During testing, the probe card 100 is coupled to the testkey 70 in such a manner that the six probe pins 110, 120, 130, 140, 150, 160 on the probe card 100 make electrical contacts respectively with the test pads 10, 20, 30, 40, 50, 60 on the testkey 70. This allows the first voltage $V_{CC1}$ to be supplied via the first probe pin 110 and the first test pad 10 to the $V_{CC1}$ port of the device unit 250, and the second voltage $V_{CC2}$ to be supplied via the fifth probe pin 150 and the fifth test pad 50 to the $V_{CC2}$ port of the device unit 250, while connecting the GND port of the device unit 250 via the sixth test pad 60 and the sixth probe pin 160 to the ground.

With this power connection, the device unit 250 will send out an output signal from the $V_{OUT}$ port, which is then transferred to the three test pads 20, 30, 40 and onwards to the probe pins 120, 130, 140.

The second probe pin 120 and the fourth probe pin 140 are dummy output for guard, and the signals transferred to them will be respectively bypassed via the parasite capacitance $C_{P12}$ to the first probe pin 110 and via the parasite capacitance $C_{P45}$ to the fifth probe pin 150. The pin assignment for the test pads is summarized shown below:

First test pad 10⇋First voltage $V_{CC1}$
Second test pad 20⇋First dummy output
Third test pad 30⇋Real signal output
Fourth test pad 40⇋Second dummy output
Fifth test pad 50⇋Second voltage $V_{CC2}$
Sixth test pad 60⇋Ground In practice, the first voltage $V_{CC1}$ is equal in magnitude to the second voltage $V_{CC2}$, and can be obtained from separate voltage sources.

In accordance with the invention, a symmetrical node-potential scheme is devised to offset the parasite capacitances between the six probe pins 110, 120, 130, 140, 150, 160 for the purpose of eliminating the undesired effects resulted from these parasite capacitances that are mentioned in the background section of this specification. The symmetrical node-potential scheme is based on the principle fact that, when two signals of the same potential, phase, and frequency are applied to the opposite ends of a circuit element, that circuit element can be regarded as nonexistent.

In the case of FIG. 2, assume $V_1$ is the potential at the node 170 on the first probe pin 110; $V_2$ is the potential at the node 180 on the second probe pin 120; $V_3$ is the potential at the node 190 on the third probe pin 130; $V_4$ is the potential at the node 200 on the fourth probe pin 140; $V_5$ is the potential at the node 210 on the fifth probe pin 150; and $V_6$ is the potential at the node 220 on the sixth probe pin 160. Then, since $V_2=V_3=V_4=V_{OUT}$, i.e., the potential levels on both ends of the parasite capacitance $C_{P23}$ and on both ends of the parasite capacitance $C_{P45}$ are the same, no currents will be resulted to flow through these two parasite capacitances $C_{P23}$ and $C_{P45}$. Moreover, since $V_1=V_5=V_{CC1}$ (=$V_{CC2}$) and $V_3=V_4=V_{OUT}$, the potential difference between $V_2$ and $V_1$ (designated by $V_{21}$) is equal to the potential difference between $V_4$ and $V_5$ (designated by $V_{45}$), e., $$V_{21}=V_2-V_1=V_{45}=V_4-V_5$$

This also causes the parasite capacitances $C_{P23}$ and $C_{P34}$ to remain open-circuited, thus preventing the output signal $V_{OUT}$ in the third probe pin 130 from being bypassed through the parasite capacitances $C_{P23}$ and $C_{P34}$ to the neighboring probe pins. Therefore, the received signal from the third probe pin 130 is substantially unaffected that allows the test instrument to obtain reliable measurements of electrical characteristics from the output signal.

In conclusion, the invention has several advantages over the prior art. First, the use of the symmetrical node-potential scheme to offset the parasite capacitances between the probe pins allows the output signal to be substantially unaffected, such that the measurements can be more precise. Second, since no additional hardware components, as frequency dividers or additional stages to ring oscillators are required, the test connecting device of the invention is easy to implement, without having to take up further circuit areas in the integrated circuits.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A test connecting device, comprising:

a testkey including:
at least one device unit having a first voltage port, a second voltage port, a signal output port, and a ground port; and
at least six test pads arranged in a row, including a first test pad electrically connected to the first voltage port of said device unit; a second test pad electrically connected to the signal output port of said device unit; a third test pad electrically connected to the signal output port of said device unit; a fourth test pad electrically connected to the signal output port of said device unit; a fifth test pad electrically connected to the second voltage port of said device unit; and a sixth test pad electrically connected to the ground port of said device unit; and a probe card, including:
at least six probe pins arranged in a row corresponding to said at least six test pads on said testkey, said at least six probe pins including:
a first probe pin having one end connected to a first voltage supply and the other end for use to make electrical contact with said first test pad on said testkey during testing;
a second probe pin neighboring said first probe pin, said second probe pin having one end serving as dummy output for guard and the other end for use to make electrical contact with said second test pad on said testkey during testing;
a third probe pin neighboring said the second probe pin, said third probe pin having one end serving as output for the output signal from the signal output port of said device unit and the other end for use to make electrical contact with said third test pad on said testkey during testing;
a fourth probe pin neighboring said third probe pin, said fourth probe pin having one end serving as dummy output for guard and the other end for use to make electrical contact with said fourth test pad on said testkey during testing;
a fifth probe pin neighboring said fourth probe pin, said fifth probe pin having one end connected to a second voltage supply and the other end for use to make electrical contact with said fifth test pad on said testkey during testing; and
a sixth probe pin neighboring said fifth probe pin, said fifth probe pin having one end connected to the ground and the other end for use to make electrical contact with said sixth test pad on said testkey during testing.

2. The test connecting device of claim 1, wherein said device unit includes a ring oscillator for use to test the electrical characteristics of an integrated circuit.

3. The test connecting device of claim 2, wherein the electrical characteristics include the resistance value of a resistor.

4. The test connecting device of claim 2, wherein the electrical characteristics include the capacitance value of a capacitor.

5. The test connecting device of claim 2, wherein the electrical characteristics include the inductance value of an inductor.

6. The test connecting device of claim 2, wherein the electrical characteristics include the frequency response of the integrated circuit.

7. The test connecting device of claim 2, wherein the electrical characteristics include the current-versus-voltage relationship of a transistor in the integrated circuit.

8. The test connecting device of claim 1, wherein said device unit includes a frequency divider.

9. The test connecting device of claim 1, wherein said probe card is an input/output device for a semiconductor test instrument.

* * * * *